US010461669B2

(12) United States Patent
Takao et al.

(10) Patent No.: US 10,461,669 B2
(45) Date of Patent: Oct. 29, 2019

(54) WIND POWER GENERATION DEVICE

(71) Applicants: TOYODA IRON WORKS CO., LTD., Toyota-shi, Aichi (JP); NATIONAL UNIVERSITY CORPORATION, HIROSHIMA UNIVERSITY, Higashi-Hiroshima-shi, Hiroshima (JP)

(72) Inventors: Hidenobu Takao, Toyota (JP); Yasuhiro Sone, Toyota (JP); Hidemi Mutsuda, Higashi-Hiroshima (JP); Yoshikazu Tanaka, Higashi-Hiroshima (JP)

(73) Assignees: TOYODA IRON WORKS CO., LTD., Toyota-shi (JP); NATIONAL UNIVERSITY CORPORATION HIROSHIMA UNIVERSITY, Higashi-Hiroshima-shi (JP)

( * ) Notice: Subject to any disclaimer, the term of this patent is extended or adjusted under 35 U.S.C. 154(b) by 472 days.

(21) Appl. No.: 15/328,738

(22) PCT Filed: Apr. 16, 2015

(86) PCT No.: PCT/JP2015/061768
§ 371 (c)(1),
(2) Date: Jan. 24, 2017

(87) PCT Pub. No.: WO2016/013263
PCT Pub. Date: Jan. 28, 2016

(65) Prior Publication Data
US 2017/0207730 A1  Jul. 20, 2017

(30) Foreign Application Priority Data
Jul. 24, 2014 (JP) .................................. 2014-151206

(51) Int. Cl.
*H01L 41/113* (2006.01)
*H02N 2/18* (2006.01)
(Continued)

(52) U.S. Cl.
CPC ................ *H02N 2/185* (2013.01); *F03D 5/06* (2013.01); *F03D 7/00* (2013.01); *F03D 9/20* (2016.05);
(Continued)

(58) Field of Classification Search
CPC .. H02N 2/185; F03D 9/20; F03D 9/25; F03D 7/00; F03D 5/06; H01L 41/1134; F05B 2220/709; Y02E 10/70; Y02E 10/725
(Continued)

(56) References Cited

U.S. PATENT DOCUMENTS

2006/0202592 A1* 9/2006 Ruggeri .............. H01L 41/0933
310/349
2011/0229322 A1* 9/2011 Tadayon ................ F03D 1/065
416/91
2012/0086310 A1  4/2012 Allaei

FOREIGN PATENT DOCUMENTS

JP  H11-303726 A  11/1999
JP  2003-164136 A  6/2003
(Continued)

OTHER PUBLICATIONS

May 30, 2017 Office Action issued in Japanese Patent Application No. 2014-151206.
(Continued)

Primary Examiner — Thomas M Dougherty
(74) Attorney, Agent, or Firm — Oliff PLC

(57) ABSTRACT

A wind power generation system including a power generation unit having an elastically deformable base material in a shape of a longitudinal flat plate and a piezoelectric element
(Continued)

disposed on the base material, and which generates electricity as the power generation unit is vibrated; the piezoelectric element is repeatedly bent and deformed by the vibration and stacked on the base material, the wind power generation system being configured to include a tension adjusting device that, when a wind speed is increased, moves the movable member to increase a tensile force that pulls the power generation unit in the longitudinal direction, and the tension adjusting device being a lift generating member that is formed integrally with the movable member so as to be extended and to have wing shape to both sides of the movable member and that moves the movable member based on lift generated according to the wind speed.

6 Claims, 13 Drawing Sheets

(51) Int. Cl.
  *F03D 9/25* (2016.01)
  *F03D 5/06* (2006.01)
  *F03D 9/20* (2016.01)
  *F03D 7/00* (2006.01)

(52) U.S. Cl.
  CPC ............ *F03D 9/25* (2016.05); *H01L 41/1134* (2013.01); *F05B 2220/709* (2013.01); *Y02E 10/70* (2013.01); *Y02E 10/725* (2013.01)

(58) Field of Classification Search
  USPC .................................. 310/339; 290/2 R, 2 A
  See application file for complete search history.

(56) References Cited

FOREIGN PATENT DOCUMENTS

| | | |
|---|---|---|
| JP | 2007-198175 A | 8/2007 |
| JP | 2012-237264 A | 12/2012 |

OTHER PUBLICATIONS

Jun. 30, 2015 Search Report issued in International Patent Application No. PCT/JP2015/061768.

Jul. 8, 2016 International Preliminary Report on Patentability issued in International Patent Application No. PCT/JP2015/061768.

* cited by examiner

FIG.9
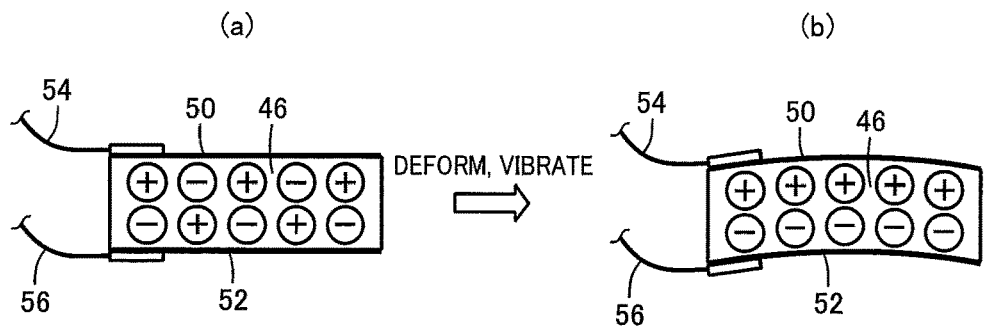
FIG.10
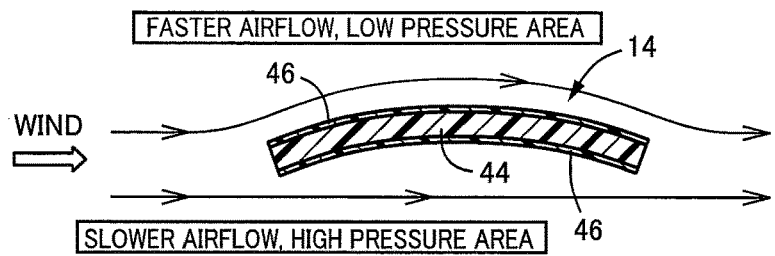
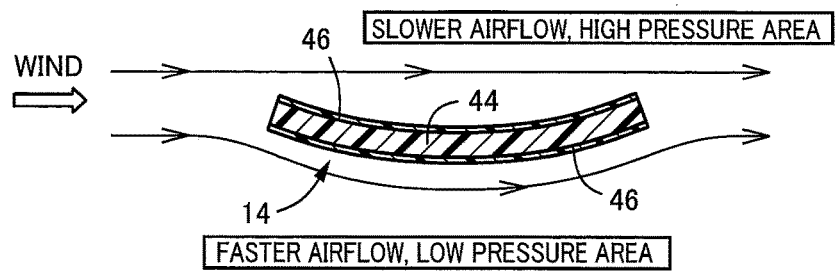

WIND POWER GENERATION DEVICE

TECHNICAL FIELD

The present invention relates to wind power generation systems, and more particularly to improvement in wind power generation systems that generate electricity as a power generation unit in the shape of a longitudinal flat plate is vibrated so that an intermediate portion of the power generation unit in the longitudinal direction reciprocates in the thickness direction of the power generation unit and a piezoelectric element is repeatedly bent and deformed by the vibration.

BACKGROUND ART

Wind power generation systems are known in the art (a) which include a power generation unit having an elastically deformable base material in the shape of a longitudinal flat plate and a piezoelectric element disposed on the base material, (b) in which the power generation unit is held at its both longitudinal ends and is placed at a position where wind blows, and which generates electricity as the power generation unit is vibrated so that an intermediate portion of the power generation unit in a longitudinal direction reciprocates in the thickness direction of the power generation unit and the piezoelectric element is repeatedly bent and deformed by the vibration. The system described in Patent Document 1 is an example of such wind power generation systems and uses a thin piezoelectric ceramic plate as the piezoelectric element. A piezoelectric film made of resin as described in Patent Document 2 may also be used as the piezoelectric element.

RELATED ART DOCUMENTS

Patent Documents

Patent Document 1: Japanese Patent Application Publication No. 2007-198175
Patent Document 2: Japanese Patent Application Publication No. 2012-237264

SUMMARY OF THE INVENTION

Problem to be Solved by the Invention

In such conventional wind power generation systems, the base material and the piezoelectric element can be damaged if the power generation unit is vibrated with excessive amplitude by strong wind. In particular, in the case where the thin piezoelectric ceramic plate is used as the piezoelectric element, the piezoelectric element is more likely to be broken as it is fragile. As a solution to this, the power generation unit may be pulled in the longitudinal direction and held in this state. This configuration can reduce the amplitude of vibration that is caused by strong wind due to pulling force and can prevent damage etc. of the power generation unit due to an increase in amplitude. However, this configuration affects power generation capability as it also reduces the amplitude of vibration in a normal wind speed range in which the power generation unit is unlikely to be damaged.

The present invention was developed in view of the above circumstances, and it is an object of the present invention to achieve stable, efficient power generation with wind in a wide wind speed range while restraining damage of a wind power generation system due to an increase in amplitude of vibration in case of strong wind without affecting power generation capability in a normal wind speed range, while the wind power generation system generates electricity by bending and deformation of a piezoelectric element associated with vibration of a power generation unit caused by wind.

Solution to Problem

To achieve the above object, a first aspect of the invention provides a wind power generation system including (a) a power generation unit having an elastically deformable base material in a shape of a longitudinal flat plate and a piezoelectric element disposed on the base material, (b) in which the power generation unit is held at its both longitudinal ends and is placed at a position where wind blows, and which generates electricity as the power generation unit is vibrated so that an intermediate portion of the power generation unit in a longitudinal direction reciprocates in a thickness direction of the power generation unit and the piezoelectric element is repeatedly bent and deformed by the vibration, the wind power generation system characterized in that (c) a piezoelectric film made of resin is used as the piezoelectric element, and the piezoelectric element is stacked on the base material, (d) at least one of the longitudinal ends of the power generation unit is coupled to a movable member that is movable in the longitudinal direction of the power generation unit, and (e) the wind power generation system includes a tension adjusting device that, when a wind speed is increased, moves the movable member to increase a tensile force that pulls the power generation unit in the longitudinal direction.

A second aspect of the invention provides the wind power generation system recited in the first aspect of the invention, characterized in that the tension adjusting device is a lift generating member that is formed integrally with the movable member so as to be extended and to have wing shape to both sides of the movable member and that moves the movable member based on lift generated according to the wind speed.

A third aspect of the invention provides the wind power generation system recited in the first or second aspect of the invention, characterized in that the movable member is disposed so as to be move between a first position where the tensile force is small and a second position where the tensile force is large, and is positioned at the first position by a biasing force of an elastic member, and as the wind speed increases, the movable member is moved toward the second position against the biasing force of the elastic member by the tension adjusting device.

A fourth aspect of the invention provides the wind power generation system recited in any one of the first to third aspects of the invention, characterized in that a plurality of the power generation units are arranged in parallel inside a rectangular frame-shaped holding member in such an attitude that flat plate surfaces of the longitudinal flat plates are parallel to each other and the longitudinal directions of the power generation units extend in the same direction.

A fifth aspect of the invention provides the wind power generation system recited in the fourth aspect of the invention, characterized in that (a) the tension adjusting device is the lift generating member that is formed integrally with the movable member so as to be extended and to have wing shape to both sides of the movable member and that moves the movable member based on the lift generated according to the wind speed, and (b) the movable member provided with the lift generating member is disposed at one of the longitudinal ends of each of the power generation units arranged in parallel, and the one longitudinal ends of the plurality of power generation units are located alternately on opposite sides.

A sixth aspect of the invention provides the wind power generation system recited in the fourth aspect of the invention, characterized in that (a) of the longitudinal ends of the plurality of power generation units arranged in parallel, one longitudinal ends located on the same side in the longitudinal direction, are coupled to a plurality of the movable members corresponding to the plurality of power generation units, and (b) the tension adjusting device is a common lift generating member that has wing shape and is disposed over the plurality of movable members so as to be extended to both sides of the plurality of movable members and that moves the plurality of movable members together based on the lift generated according to the wind speed.

A seventh aspect of the invention provides the wind power generation system recited in the fourth or fifth aspect of the invention, characterized in that (a) the base materials of the plurality of power generation units are different in hardness from each other, and (b) a wind speed range in which the tensile force is increased by the tension adjusting device varies according to the hardness of the base material.

Advantageous Effects of the Invention

According to the wind power generation system as described above, at least one of the longitudinal ends of the power generation unit is coupled to the movable member. When wind is strong, the movable member is moved by the tension adjusting device, and the tensile force that is applied to the power generation unit increases accordingly. This restrains the power generation unit from vibrating with excessive amplitude in case of strong wind and thus restrains damage to the power generation unit. In the wind conditions other than strong wind, the power generation unit is subjected to a small tensile force and can vibrate with large amplitude. Electricity can therefore be efficiently generated due to bending and deformation of the piezoelectric elements. Since the piezoelectric films made of resin are used as piezoelectric elements, the power generation unit is less likely to be broken as compared to the case where thin piezoelectric ceramic plates are used, and the power generation unit can be vibrated with up to relatively large amplitude to generate electricity. The power generation unit can thus stably and efficiently generate electricity with wind in a wide wind speed range.

In the second aspect of the invention, the lift generating member formed integrally with the movable member so as to be extended and to have wing shape to both sides of the movable member is used as the tension adjusting device. Accordingly, the movable member is mechanically moved according to the wind speed, and the system can be easily and inexpensively produced as compared to the case where movement of the movable member is electrically controlled according to the wind speed.

In the third aspect of the invention, the movable member is disposed so as to move between the first and second positions. The movable member is positioned at the first position by the biasing force of the elastic member, and when wind is strong, is moved toward the second position by the tension adjusting device. Accordingly, the overall operation of the system including vibration of the power generation unit is stable during normal wind power generation. Moreover, when wind is strong, the movable member is not moved more than necessary, and the power generation unit can be prevented from being subjected to an excessive tensile force.

In the fourth aspect of the invention, the plurality of power generation units are arranged in parallel inside the rectangular holding member in such an attitude that the power generation units are parallel to each other and the longitudinal directions of the power generation units extend in the same direction. The multiplicity of power generation units are thus densely disposed so as to be close to each other, whereby a large electromotive force can be easily secured.

The fifth aspect of the invention relates to the case where the lift generating member that is formed integrally with the movable member so as to be extended and to have wing shape to both sides of the movable member is used as the tension adjusting device. The movable member provided with the lift generating member is disposed at one of the longitudinal ends of each of the power generation units arranged in parallel, and each of the movable members is located alternately on opposite sides of the power generation units. Accordingly, the lift generating member can be extended in such a range that the lift generating member does not contact the power generation units adjoining the power generation units, and the lift can be increased. Since the power generation units are pulled by this lift, damage that may be caused to the power generation units by strong wind can be restrained. Moreover, power generation efficiency can be increased by increasing the lateral dimension of the power generation units etc. Alternatively, if the dimension of the lift generating member is the same, the size of the wind power generation system can be reduced by placing the power generation units with lift generating member close to each other such that the power generation units with the lift generating member do not interfere with each other.

In the sixth aspect of the invention, the movable members are disposed at one ends on the same side in the longitudinal direction of the plurality of power generation units that are arranged in parallel and the lift generating member is disposed over the plurality of the movable members. Since the lift generating member is a continuous member, the area for lift generation is increased, and the lift is increased accordingly. The sixth aspect of the invention thus has functions and effects similar to those of the fifth aspect of the invention.

In the seventh aspect of the invention, the base materials of the plurality of power generation units are different in hardness from each other, and a wind speed range in which the tensile force is increased by the tension adjusting device varies according to the hardness of the base material. The power generation units can thus be vibrated with large amplitude in predetermined wind speed ranges according to the hardness of the base material and can efficiently generate electricity. As the wind speed increases, the tensile forces that are applied to the power generation units can be individually increased so as to restrain damage to the power generation units. Stable, efficient power generation can thus be achieved with wind in a wide wind speed range as a whole.

BRIEF DESCRIPTION OF THE DRAWINGS

FIGS. 9A and 9B show diagrams illustrating principles of power generation of the power generation unit.

FIG. 10 is a diagram illustrating principles of vibration of the power generation unit placed substantially parallel to the direction of wind flow.

MODES FOR CARRYING OUT THE INVENTION

Figure 1:
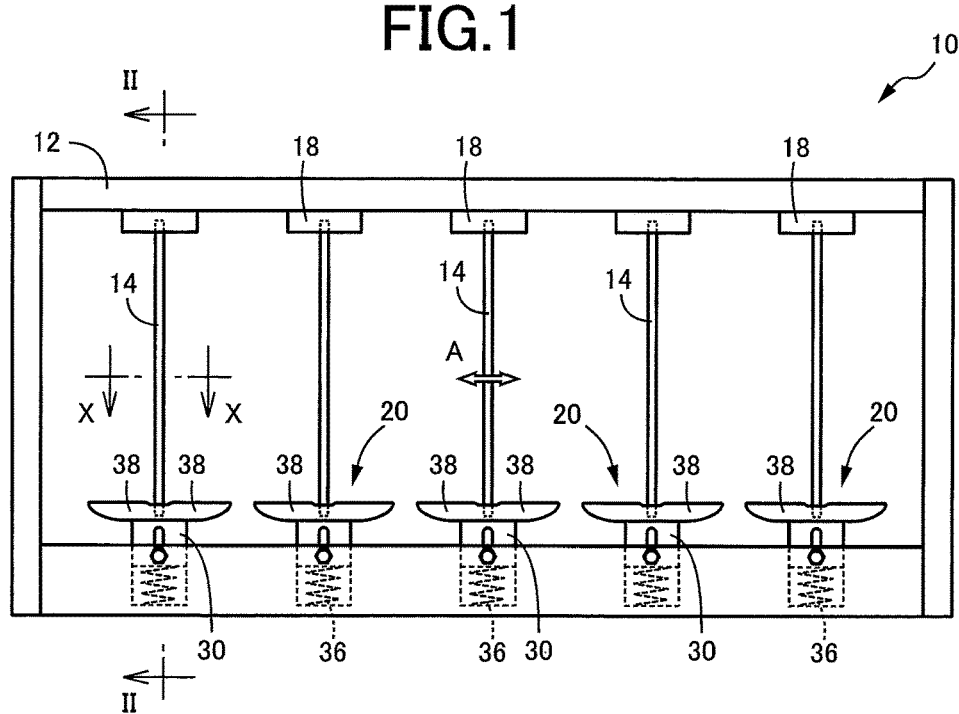
FIG. 1 is a schematic front view of a wind power generation system according to an embodiment of the present invention.

The present invention is installed in real estate such as land or a building and generates electricity using wind. The present invention is also applicable to the case where the invention is mounted on a moving body such as an automobile, an airplane, or a ship and generates electricity when the invention relatively receives wind as the moving body moves.

For example, an elastomer such as natural rubber or synthetic rubber, silicone, etc. are preferably used as the base material. Deformation characteristics and power generation characteristics for the wind speed vary depending on hardness of the base material. Accordingly, electric power generation efficiency can be improved in a wide wind speed range by combining a plurality of kinds of power generation units using a plurality of kinds of base materials that are different in hardness from each other.

The piezoelectric film is a resin film made of a piezoelectric material having a piezoelectric effect. Polyvinylidene fluoride (PVDF), polyvinylidene cyanide, etc. are preferably used. An electrode film made of aluminum etc. is formed on both surfaces of the piezoelectric film by vapor deposition, sputtering, conductive paste, etc., and electrical wires are connected to the electrode films. The base material and the piezoelectric film need only be alternately stacked to form a two (one layer each) or more layer structure. However, in order to enhance power generation efficiency, it is desirable to stack two or more piezoelectric films to form a three or more layer structure together with the base material. In the case of the three-layer structure, the piezoelectric film is bonded to both surfaces of the base material.

The tension adjusting device may continuously change tension by continuously moving the movable member according to the wind speed. Alternatively, the tension adjusting device may need only to switch the tension in two stages by moving the movable member from the first position to the second position when the wind speed reaches a certain value. In the case where the tension adjusting device is provided at both longitudinal ends of the power generation unit, the tension can also be changed in three stages. In the case where the movable member is electrically moved according to the wind speed, the tension can also be changed in multiple stages, namely four or more stages.

For example, the airfoil-shaped lift generating member is preferably used as the tension adjusting device. However, the movable member may be moved by an air cylinder which is operated by an air pump with rotational energy of a rotating body that rotates according to the wind speed. The wind speed may be measured with an anemometer and the movable member may be moved by electrically operating an air cylinder, a screw mechanism, etc. according to the measured wind speed. The tension adjusting device can thus be implemented in various forms.

Embodiments

Embodiments of the present invention will be described in detail below with reference to the accompanying drawings. In the following embodiments, the drawings are shown simplified or deformed as appropriate for explanation purposes, and the proportions, shapes, etc. of the parts are not necessarily accurately shown in the drawings.

Figure 2:
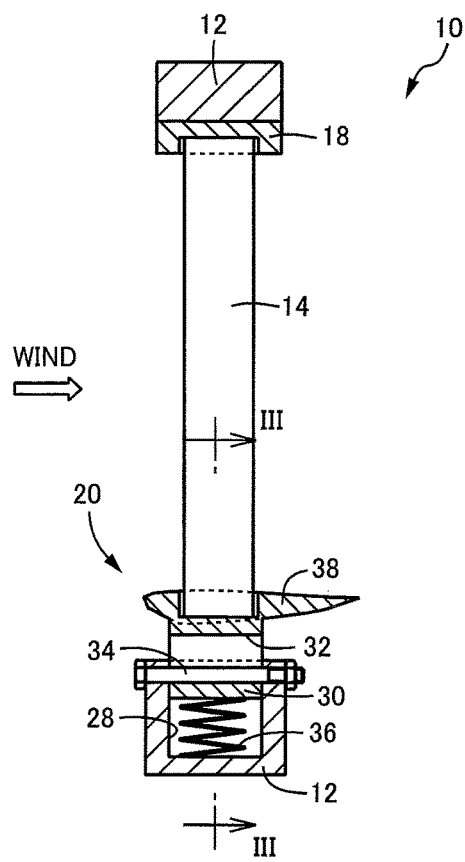
FIG. 2 is a sectional view taken along line II-II and viewed in the direction of arrows II in FIG. 1.
Figure 3:
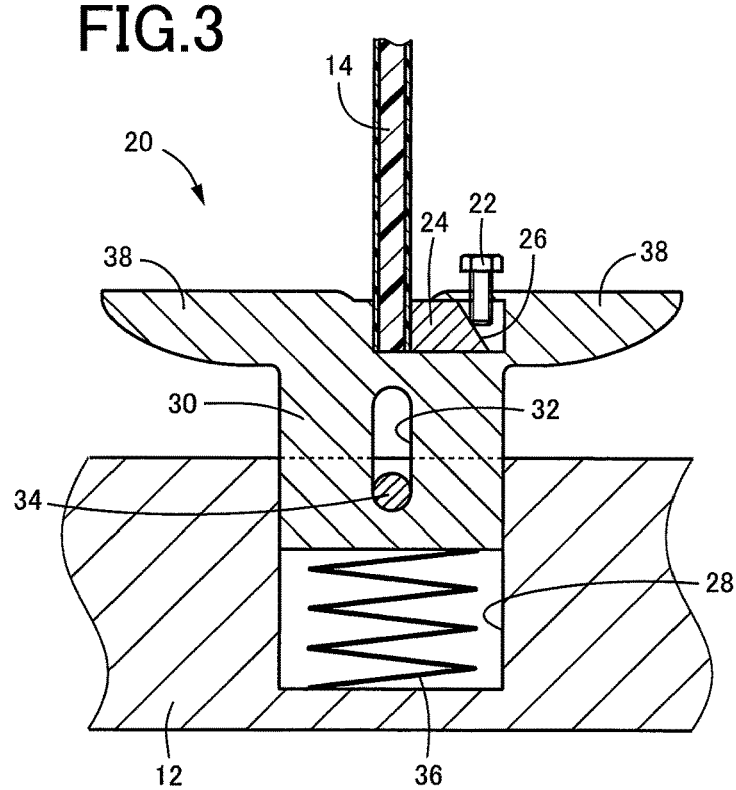
FIG. 3 is an enlarged sectional view taken along line III-III and viewed in the direction of arrows III in FIG. 2.

FIG. 1 is a schematic front view of a wind power generation system 10 according to an embodiment of the present invention. FIG. 2 is a sectional view taken along line II-II and viewed in the direction of arrows II in FIG. 1. FIG. 3 is an enlarged sectional view taken along line and viewed in the direction of arrows III in FIG. 2. The wind power generation system 10 has a rectangular frame-shaped holding member 12 and a multiplicity of (in the present embodiment, five) power generation units 14 held by the holding member 12. The multiplicity of power generation units 14 have the shape of a rectangular flat plate and are arranged in the holding member 12 in a substantially vertical attitude substantially perpendicular to the direction of wind flow (the direction perpendicular to the plane of paper of FIG. 1) so as to be parallel to each other and to be separated from each other in the horizontal direction perpendicular to the direction of wind flow. The power generation units 14 are placed so as to receive wind in the direction perpendicular to the plane of paper of FIG. 1, based on a basic wind direction. However, since the wind direction is not constant, the entire wind power generation system 10 may, for example, be turned about its substantially vertical rotation axis according to the wind direction, the plurality of power generation units 14 may be individually turned about their substantially vertical rotation axes, or the wind power generation system 10 or the plurality of power generation units 14 may be turnably mounted. In the case where the wind power generation system 10 is mounted on a moving body such as an automobile or a ship, the wind power generation system 10 may be fixed in a certain attitude perpendicular to the direction in which the moving body travels. In the wind power generation system 10 of FIG. 1, the multiplicity of power generation units 14 are placed substantially vertically so as to be separated from each other in the horizontal direction. However, the multiplicity of power generation units 14 may be placed substantially horizontally so as to be separated from each other in the vertical direction, as rotated by substantially 90° from FIG. 1 so as to extend horizontally.

Each of the multiplicity of power generation units 14 is held at its both longitudinal ends by the holding member 12 via a fixing member 18 and a tension adjusting mechanism 20. The fixing member 18 is fixedly attached to the holding member 12, whereas the tension adjusting mechanism 20 has a shaft-shaped (cylinder- or prism-shaped) slide fitting portion 30 and is fitted in a fitting hole 28 of the holding member 12 so as to be move in the axial direction, namely in the vertical direction, or the longitudinal direction of the power generation unit 14. The power generation unit 14 has its lower end coupled to the upper end of the slide fitting portion 30. As shown in FIG. 3, a bolt 22 and a clamp member 24 are disposed in the upper end of the slide fitting portion 30. The clamp member 24 is pressed by the power generation unit 14 via a sloped surface 26, whereby the end of the power generation unit 14 is clamped and firmly fixed between the clamp member 24 and the slide fitting portion 30 along the entire lateral length of the power generation unit 14. Although not shown in the figures, the upper end of the power generation unit 14 is also pressed against and firmly fixed to the fixing member 18 by a clamp member along the entire lateral length of the power generation unit 14. The ends of the power generation unit 14 may be fixed to the fixing member 18 and the slide fitting portion 30 by other fixing means such as an adhesive.

The slide fitting portion 30 corresponds to the movable member. The slide fitting portion 30 has an elongated hole 32 extending in the vertical direction, and a positioning pin 34 disposed substantially horizontally in the holding member 12 is inserted through the elongated hole 32. The slide fitting portion 30 can thus move vertically between a first position (the state shown in FIGS. 3 and 4) where the positioning pin 34 contacts the lower end of the elongated hole 32 and a second position (the state shown in FIG. 5) where the positioning pin 34 contacts the upper end of the elongated hole 32. The first position is the end of upward travel of the slide fitting portion 30, where the power generation unit 14 is subjected to a relatively small tensile force. The second position is the end of downward travel of the slide fitting portion 30, where the power generation unit 14 is subjected to a relatively large tensile force. The tensile force that is applied to the power generation unit 14 increases as the slide fitting portion 30 is moved from the first position toward the second position. A helical compression spring 36 serving as biasing means is disposed on the bottom of the fitting hole 28. Normally, the slide fitting portion 30 is held at the first position by the biasing force of the helical compression spring 36, and the power generation unit 14 receives wind and is vibrated while being pulled by the relatively small tensile force. The basic shape of the power generation unit 14, or the shape of the power generation unit 14 when not affected by wind, is a rectangular, substantially flat plate according to the tensile force, as shown in FIGS. 1 and 2.

Figure 4:
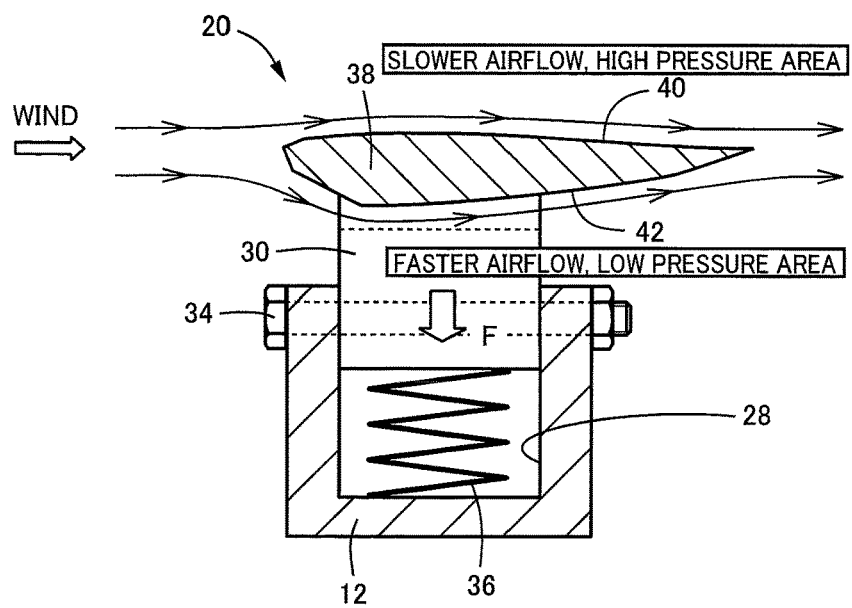
FIG. 4 is a diagram illustrating lift that is generated by an airfoil-shaped lift generating member.
Figure 5:
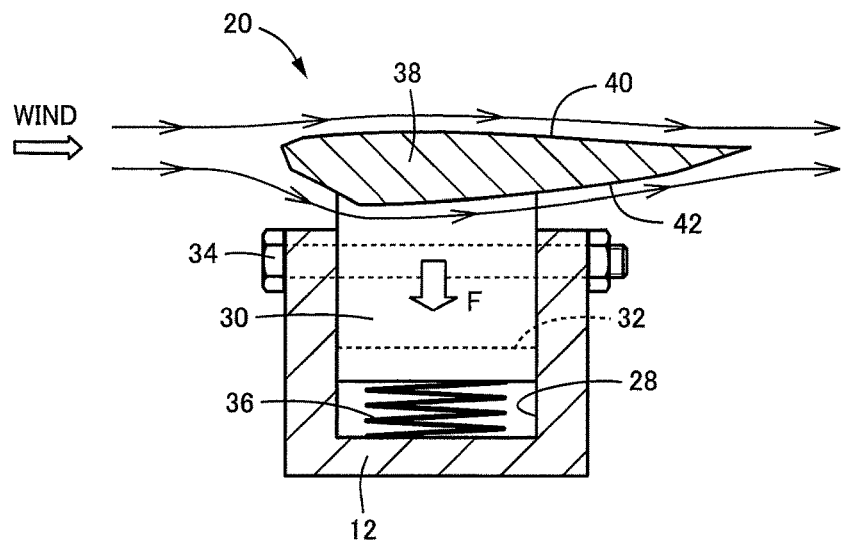
FIG. 5 is a diagram showing a slide fitting portion of FIG. 4 moved downward by the lift against the biasing force of an elastic member.

A pair of airfoil-shaped portions 38 are formed integrally with the slide fitting portion 30 so as to be extended and to have wing shape from the upper end of the slide fitting portion 30 to the right and left. The airfoil-shaped portions 38 are the lift generating member that generates lift when they receive wind. As shown in FIG. 4, the airfoil-shaped portions 38 are provided in such an attitude that their flat front surfaces 40 face upward and their convex back surfaces 42 face downward. Airflow is faster underneath the back surfaces 42, whereby a low pressure area is created underneath the back surfaces 42. Downward lift F is therefore generated as shown by the white arrow in the figure. While the wind is relatively light, this lift F is relatively small, and the slide fitting portion 30 is held at the first position shown in FIG. 4 by the biasing force of the helical compression spring 36 regardless of the lift F. However, as the wind becomes stronger, the lift F increases accordingly. If the lift F becomes larger than the biasing force of the helical compression spring 36, the slide fitting portion 30 is moved toward the second position by the lift F as shown in FIG. 5, and the power generation unit 14 is pulled downward by a dimension t (see FIGS. 6A and 6B), and the tensile force increases accordingly. As can be seen from FIG. 5, the clearance between the airfoil-shaped portions 38 and the holding member 12 decreases as the slide fitting portion 30 is moved toward the second position. The airflow underneath the back surfaces 42 therefore becomes even faster, whereby the pressure underneath the back surfaces 42 becomes even lower and the lift F further increases accordingly. The slide fitting portion 30 is thus further pulled down toward the second position.

In the present embodiment, all the tension adjusting mechanisms 20 have the same configuration, and all the helical compression springs 36 have the same biasing force (spring constant and initial load). All the slide fitting portions 30 are moved from the first position toward the second position in substantially the same wind speed range, increasing the tensile force that is applied to the power generation units 14. The airfoil-shaped portions 38 function as the tension adjusting device that adjusts the tensile force for the power generation unit 14 according to the wind strength (wind speed). FIGS. 4 and 5 are sectional views corresponding to FIG. 2, showing in enlargement a part near the tension adjusting mechanism 20 including the airfoil-shaped portion 38 for the purpose of explaining the lift F. For example, the slide fitting portion 30 and the pair of airfoil-shaped portions 38 are molded as a single-piece member from a synthetic resin material. However, the slide fitting portion 30 and the pair of airfoil-shaped portions 38 may be formed as separate members and fixedly joined together.

Figure 7:
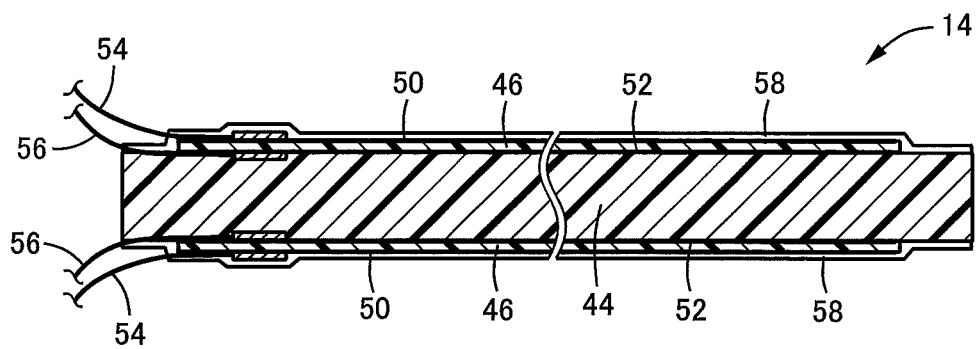
FIG. 7 is a sectional view illustrating the power generation unit of the wind power generation system of FIG. 1 taken in the longitudinal direction thereof.

As shown in FIG. 7, the power generation unit 14 is a laminate of an elastically deformable flat plate-shaped base material 44 and a pair of piezoelectric films 46 bonded to both surfaces of the base material 44. FIG. 7 is a sectional view of the power generation unit 14 taken in the longitudinal direction thereof, namely an enlarged view of the section corresponding to FIG. 3 that is a sectional view taken along line and viewed in the direction of arrows III in FIG. 2. The base material 44 is an elastic material such as an elastomer having Shore A (durometer type A) hardness in the range of, e.g., about 10 to 60. Deformation characteristics and power generation characteristics of the power generation unit 14 which are caused by wind can be adjusted by changing the hardness of the base material 44. Such deformation characteristics and power generation characteristics are determined as appropriate in advance by experiments etc., and the multiplicity of power generation units 14 are formed by using the base materials 44 made of the same material and having substantially the same hardness. The pair of piezoelectric films 46 bonded to both surfaces of the base material 44 are films made of a piezoelectric material having a piezoelectric effect. For example, polyvinylidene fluoride (PVDF) is used. Electrode films 50, 52 made of aluminum etc. are formed on both surfaces of each piezoelectric film 46 by vapor deposition, sputtering, conductive paste, etc., and electrical wires 54, 56 are connected to the electrode films 50, 52, respectively. The surfaces of the power generation unit 14 are coated with a coating material 58 such as a nonconductive synthetic resin.

Figure 8:
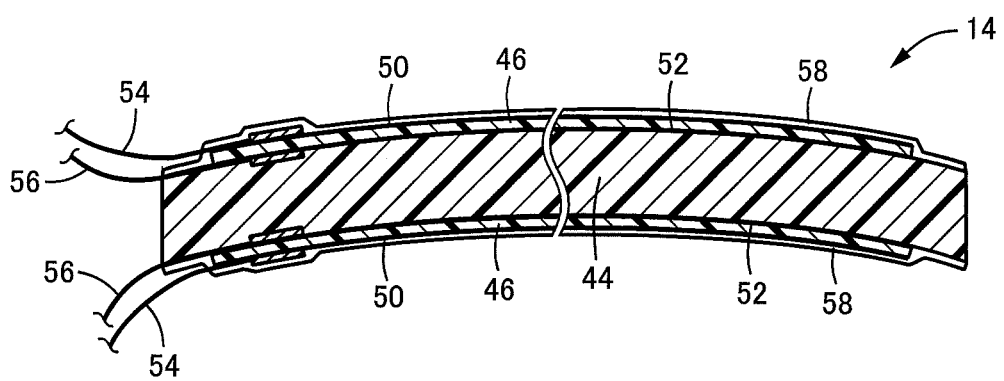
FIG. 8 is a sectional view showing the power generation unit of FIG. 7 being deflected and deformed.
Figure 11:
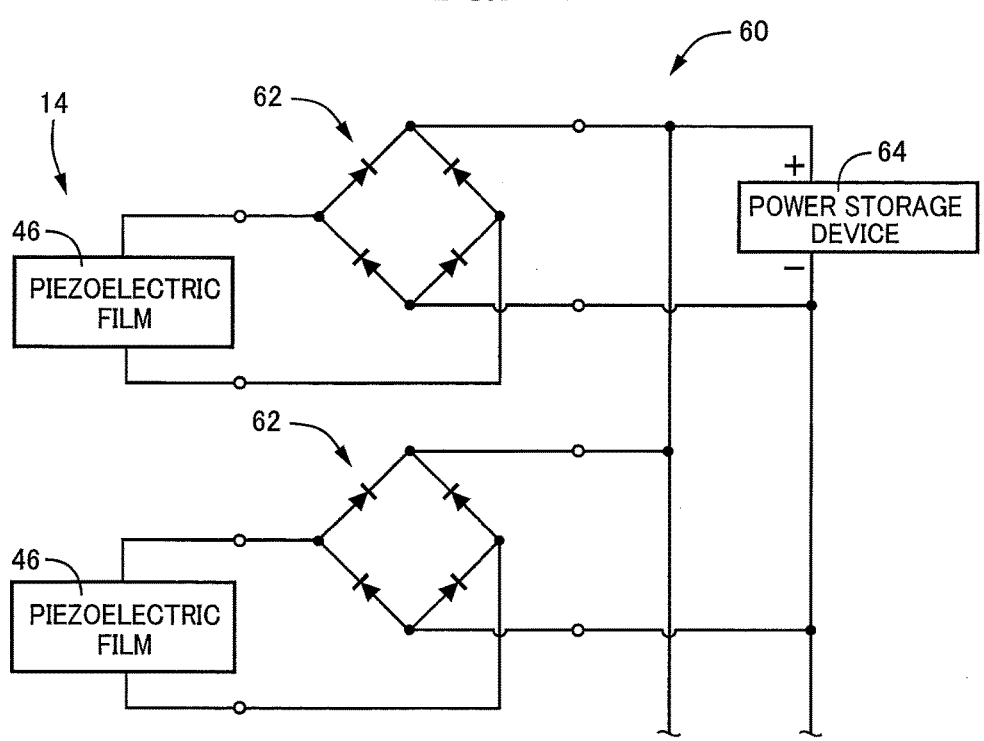
FIG. 11 is a circuit diagram showing a part of an electric circuit provided in the wind power generation system of FIG. 1.

In such a power generation unit 14, when the base material 44 is elastically deformed in its thickness direction by wind, the piezoelectric films 46 are deflected and deformed accordingly, and an electromotive force is generated between each pair of electrode films 50, 52. FIG. 8 shows an example of a modified form of the power generation unit 14 of FIG. 7, showing the power generation unit 14 with its intermediate portion elastically deformed so as to be curved upward. For example, electric charges in the piezoelectric film 46 are polarized as shown from FIG. 9A to FIG. 9B, and a potential difference is produced by this polarization. When the power generation unit 14 placed substantially parallel to the direction of wind flow is elastically deformed in its middle portion in the longitudinal direction to one side in the thickness direction (deformed state I) due to the pressure difference caused by the wind flow as shown in FIG. 10, which corresponds to the section taken along line X-X in FIG. 1, a force in the opposite direction is generated by the elasticity. The power generation unit 14 is therefore elastically deformed in its middle portion in the longitudinal direction to the other side in the thickness direction (deformed state II). The deformed state I and the deformed state II are alternately and repeatedly caused, whereby the power generation unit 14 vibrates as shown by arrow A in FIG. 1, so that polarization of the electric charges changes repeatedly and electricity can be generated continuously. The power generation unit 14 may be made to resonate under certain conditions by adjusting the natural frequency of the power generation unit 14 using the length of the power generation unit 14 and the tensile force that is applied to the power generation unit 14. FIG. 11 shows an example of an electric circuit 60 included in the wind power generation system 10. This electric circuit 60 is a part associated with a single power generation unit 14, and a power storage device 64 can be charged by rectification that is performed by rectifier bridge circuits 62. Since the signs of the potential differences that are caused in the pair of piezoelectric films 46 provided on both sides of the base material 44 change in certain relationship, one of the rectifier bridge circuits 62 may be omitted, and the rectification may be performed by a single common rectifier bridge circuit 62.

The power generation unit 14 can efficiently generate electricity when it is vibrated by wind of a moderate speed. However, the amplitude of the vibration increases as the wind speed increases. As the amplitude increases, power generation amount increases accordingly, but the power generation unit 14 may be broken. If the tensile force that is applied to the power generation unit 14 when it is disposed in the holding member 12 is increased, or the hardness of the base material 44 of the power generation unit 14 is increased, the vibration of the power generation unit 14 can be reduced to relatively small amplitude and breakage of the power generation unit 14 can be prevented even if wind is excessively strong such as a typhoon. However, if the vibration amplitude of the power generation unit 14 is reduced in this manner, the power generation unit 14 vibrates with small amplitude when wind blows at a normal speed suitable for wind power generation, such as about 20 to 60 km/h (5.6 to 16.7 m/s). This affects power generation efficiency.

Figure 6:
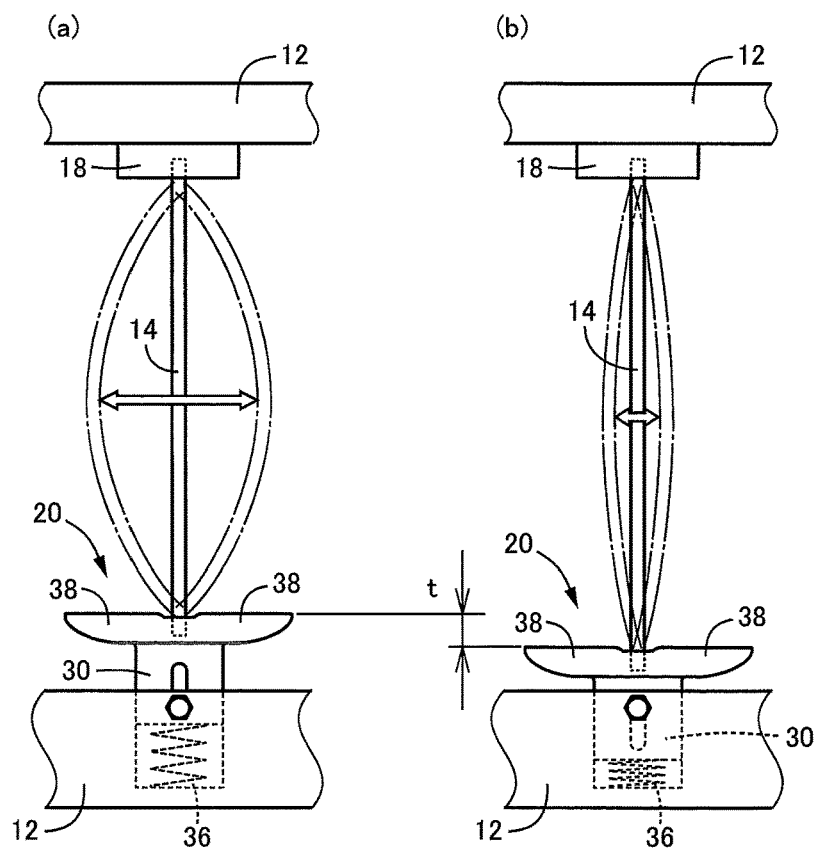
FIGS. 6A and 6B show diagrams explaining that a tensile force that is applied to a power generation unit increases and amplitude of vibration thereof decreases as the slide fitting portion is moved by the lift.

As a solution to this, in the present embodiment, the slide fitting portion 30 to which the lower end of the power generation unit 14 is coupled is disposed in the holding member 12 so as to be movable in the vertical direction. When the wind speed increases, the slide fitting portion 30 is mechanically moved down toward the second position by the lift F that is generated by the airfoil-shaped portions 38, and the tensile force that is applied to the power generation unit 14 increases accordingly. When the wind speed is relatively low, the lift F is small. The slide fitting portion 30 is therefore held at the first position as shown in FIGS. 1 to 4, and a rather small tensile force for the power generation unit 14 is maintained. Accordingly, by using a relatively soft material for the base material 44 of the power generation unit 14, the power generation unit 14 can be vibrated with relatively large amplitude even in a low wind speed range as shown in FIG. 6A (showing the case where the lift is small), and electricity can be generated efficiently. If the wind becomes strong and the lift F that is generated by the airfoil-shaped portions 38 increases, the slide fitting portion 30 is moved down toward the second position as shown in FIG. 5. The power generation unit 14 is therefore pulled downward by at most the dimension t as shown in FIG. 6B (showing the case where the lift is large). The tensile force thus increases accordingly, whereby the vibration amplitude is reduced in spite of the strong wind, and breakage of the power generation unit 14 is prevented.

The size, shape, etc. of the airfoil-shaped portions 38 are determined as appropriate in view of the material of the base material 44 of the power generation unit 14 etc. so that, when wind blows at a normal speed at which the power generation unit 14 is unlikely to be broken, the slide fitting portion 30 is held at the first position so as to allow the power generation unit 14 to vibrate with large amplitude, and when wind is strong with which the power generation unit 14 may be broken, the slide fitting portion 30 is moved toward the second position to restrain vibration of the power generation unit 14. In the present embodiment, the tensile force that is applied to the power generation unit 14 at the first position, the hardness, thickness, width dimension, and length dimension of the base material 44, etc. are set so that, at, e.g., about 20 to 60 km/h (5.6 to 16.7 m/s) of a wind range speed, and more desirably about 30 to 40 km/h (8.3 to 11.1 m/s) of a wind range speed, the slide fitting portion 30 is held at the first position and the power generation unit 14 vibrates with large amplitude and generates electricity efficiently. The size and shape of the airfoil-shaped portions 38, the spring constant and initial load of the helical compression spring 36, the stroke (dimension t) of movement of the slide fitting portion 30, etc. are set so that, if the wind speed becomes higher than the above wind speed range, the slide fitting portion 30 is continuously moved toward the second position with an increase in wind speed, the tensile force that is applied to the power generation unit 14 increases accordingly, and breakage of the power generation unit 14 is prevented.

As described above, according to the wind power generation system 10 of the present embodiment, the lower end of the power generation unit 14 is coupled to the slide fitting portion 30 of the tension adjusting mechanism 20. When wind is strong, the slide fitting portion 30 is moved from the first position toward the second position by the lift F generated by the airfoil-shaped portions 38, and the tensile force that is applied to the power generation unit 14 increases accordingly. This restrains the power generation unit 14 from vibrating with excessive amplitude in case of strong wind and thus restrains damage to the power generation unit 14. In the wind conditions other than strong wind, the slide fitting portion 30 is held at the first position and the power generation unit 14 is subjected to a small tensile force and can vibrate with large amplitude. Electricity can therefore be efficiently generated due to bending and deformation of the piezoelectric films 46.

Since the piezoelectric films 46 made of resin are used as piezoelectric elements of the power generation unit 14, the power generation unit 14 is less likely to be broken as compared to the case where thin piezoelectric ceramic plates are used, and the power generation unit 14 can be vibrated with up to relatively large amplitude to generate electricity. The power generation unit 14 can thus stably and efficiently generate electricity with wind in a wide wind speed range.

In the present embodiment, the pair of airfoil-shaped portions 38 formed integrally with the slide fitting portion 30 so as to be extended and to have wing shape to both sides of the upper end of the slide fitting portion 30 are used as the tension adjusting device. Accordingly, the slide fitting portion 30 is mechanically moved in the vertical direction according to the wind speed, and the system can be easily and inexpensively produced as compared to the case where movement of the slide fitting portion 30 is electrically controlled according to the wind speed.

The slide fitting portion 30 is disposed so as to be move between the first and second positions. The slide fitting portion 30 is positioned at the first position by the biasing force of the helical compression spring 36, and when wind is strong, is moved toward the second position by the lift F generated by the airfoil-shaped portions 38. Accordingly, the slide fitting portion 30 is held at the first position and the overall operation of the system including vibration of the power generation unit 14 is stable during normal wind power generation. Moreover, when wind is strong, the slide fitting portion 30 is not moved more than necessary, and the power generation unit 14 can be prevented from being subjected to an excessive tensile force.

The multiplicity of power generation units 14 are arranged in parallel inside the rectangular holding member 12 in such an attitude that the power generation units 14 are parallel to each other and the longitudinal directions of the power generation units 14 extend in the same direction. The multiplicity of power generation units 14 are thus densely disposed so as to be close to each other, whereby a large electromotive force can be easily secured.

Other embodiments of the present invention will be described below. In the following embodiments, the portions substantially common to the above embodiment are denoted with the same reference characters, and detailed description thereof will be omitted.

In the above embodiment, the base materials 44 of the multiplicity of power generation units 14 are made of the same material and the multiplicity of power generation units 14 have the same deformation characteristics and the same power generation characteristics, and all the slide fitting portions 30 having the power generation units 14 coupled thereto are moved from the first position toward the second position in the same wind speed range to increase the tensile force that is applied to the power generation units 14. However, the base materials 44 of the plurality of power generation units 14 may have different deformation characteristics (hardness, thickness, width, etc. that affect vibration), and the wind speed range in which the tensile force is increased by the tension adjusting device (airfoil-shaped portions 38) can be varied according to the deformation characteristics of the base materials 44. Specifically, for example, as the base material 44 is harder, the power generation unit 14 can be vibrated in a higher wind speed range and can more efficiently generate electricity while restraining breakage of the power generation unit 14. The wind speed range in which the tensile force is increased by the tension adjusting device (airfoil-shaped portions 38) can therefore be increased. The tensile force that is applied to the power generation unit 14 can be adjusted not only by the shape and size of the airfoil-shaped portions 38 but also by changing the biasing force (initial load etc.) of the helical compression spring 36. The power generation units 14 can thus be individually vibrated with large amplitude in predetermined wind speed ranges according to the hardness of the base material 44 and can efficiently generate electricity. As the wind speed increases, the tensile forces that are applied to the power generation units 14 are individually increased so as to restrain damage to the power generation units 14. Stable, efficient power generation can thus be achieved in a wide wind speed range while restraining damage to the multiplicity of power generation units 14 as a whole.

Figure 12:
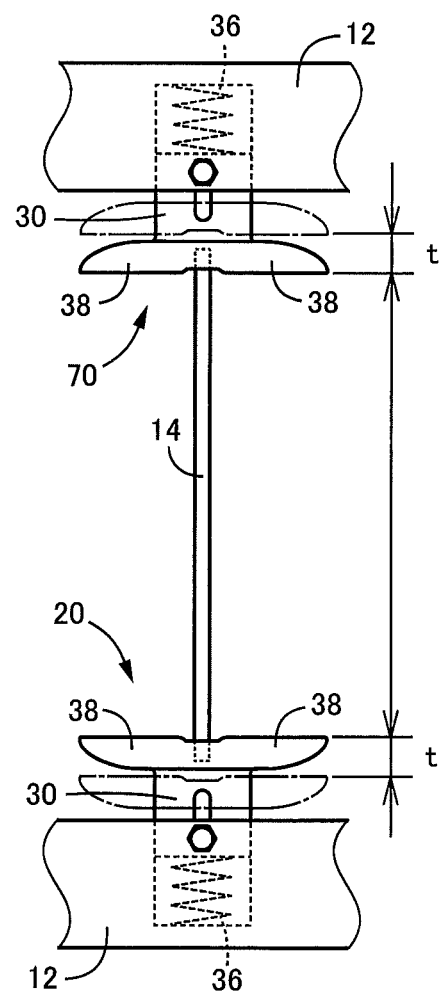
FIG. 12 is a front view illustrating another embodiment of the present invention in which a tension adjusting mechanism is provided at both longitudinal ends of the power generation unit.

FIG. 12 shows the case where the upper end of the power generation unit 14 is also attached to the holding member 12 via a tension adjusting mechanism 70. The tension adjusting mechanism 70 is formed vertically symmetrically with the tension adjusting mechanism 20. When the wind speed reaches a predetermined value, the tension adjusting mechanism 70 pulls the upper end of the power generation unit 14 upward by the dimension t to increase the tensile force. In the present embodiment, the power generation unit 14 is thus pulled by the dimension 2t in total in the vertical direction. By using the base material 44 made of a softer, stretchier material, electricity can be generated from a lower wind speed range, and in a high wind speed range, the power generation unit 14 can be pulled by the dimension 2t to increase the tensile force. Breakage of the power generation unit 14 can thus be appropriately restrained. In the case of using the base material 44 having the same hardness as in the above embodiment, power generation efficiency can be increased by increasing the longitudinal dimension of the power generation unit 14 and thus increasing the size of the piezoelectric films 46.

Figure 13:
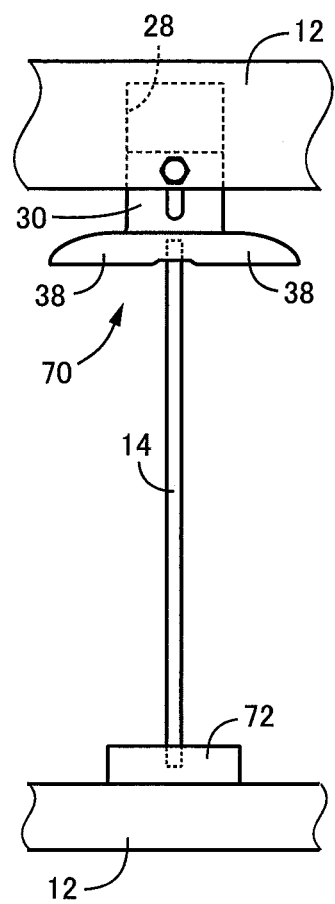
FIG. 13 is a front view illustrating still another embodiment of the present invention in which a tension adjusting mechanism is provided at the upper longitudinal end of the power generation unit and biasing means is omitted.

FIG. 13 shows the case where the power generation unit 14 has its lower end attached to the holding member 12 via a fixing member 72 and has its upper end coupled to the tension adjusting mechanism 70, but the helical compression spring 36 is omitted and the tension adjusting mechanism 70 is held at the first position by its own weight and the tensile force that is applied to the power generation unit 14. In this case, since the helical compression spring 36 is omitted, the number of components is reduced and manufacturing cost is thus reduced. The wind speed range in which the slide fitting portion 30 of the tension adjusting mechanism 70 is moved to the second position, namely the wind speed range in which the tensile force that is applied to the power generation unit 14 is increased, can be adjusted by the size and shape of the airfoil-shaped portions 38.

Figure 14:
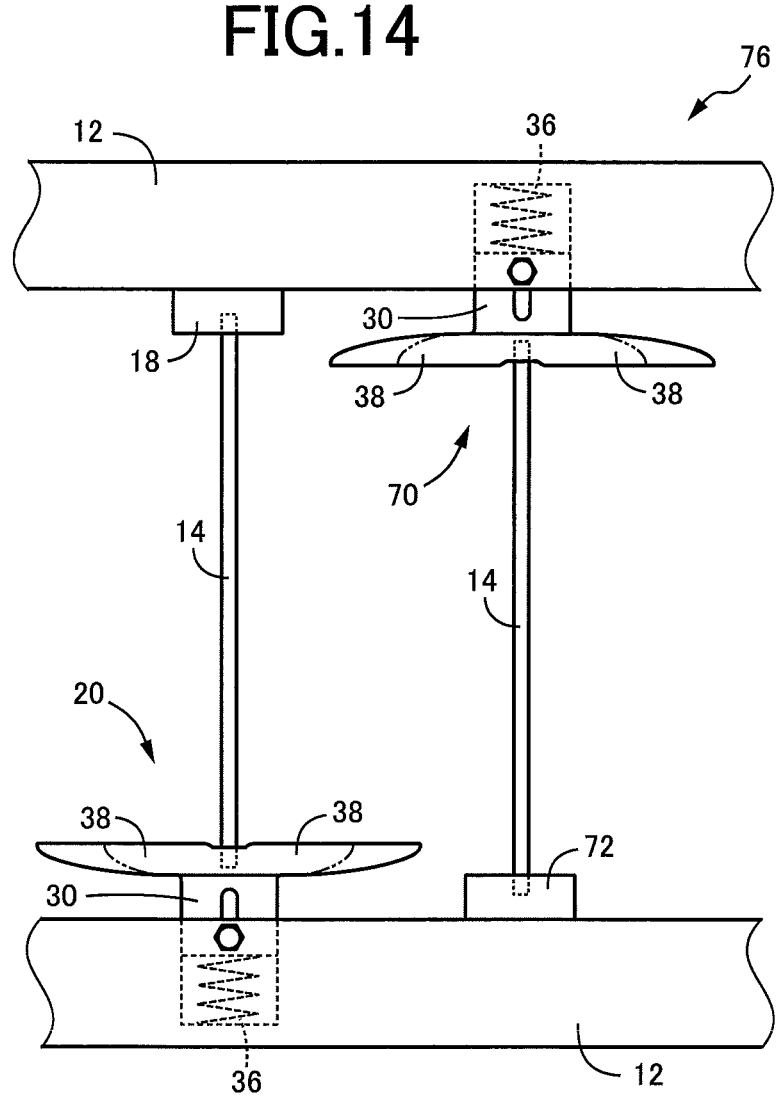
FIG. 14 is a front view illustrating yet another embodiment of the present invention in which tension adjusting mechanisms are disposed at each longitudinal end of the power generation units alternately.

In a wind power generation system 76 of FIG. 14, one longitudinal ends of the power generation units 14 arranged in parallel, which are alternately located on the opposite sides, are coupled to the tension adjusting mechanisms 20, 70. In this case, the airfoil-shaped portions 38 of each tension adjusting mechanism 20, 70 can be extended in such a range that the airfoil-shaped portions 38 do not contact their adjacent power generation units 14, and the lift F can be increased. Since the power generation units 14 are pulled by this lift F, damage that may be caused to the power generation units 14 by strong wind can be restrained. Moreover, power generation amount can be increased by increasing the lateral dimension of the power generation units 14 etc. Alternatively, if the dimensions of the airfoil-shaped portions 38 are the same, the size of the wind power generation system 76 can be reduced by placing the power generation units 14 with airfoil-shaped portions 38 close to each other such that the power generation units 14 with the airfoil-shaped portions 38 do not interfere with each other. For example, the airfoil-shaped portions 38 shown by long dashed double-short dashed lines in FIG. 14 denotes the airfoil-shaped portions 38 of FIG. 1. The airfoil-shaped portions can be extended as shown by solid lines if the interval between adjacent ones of the power generation units 14 is the same in the case of the arrangement of FIG. 1.

Figure 15:
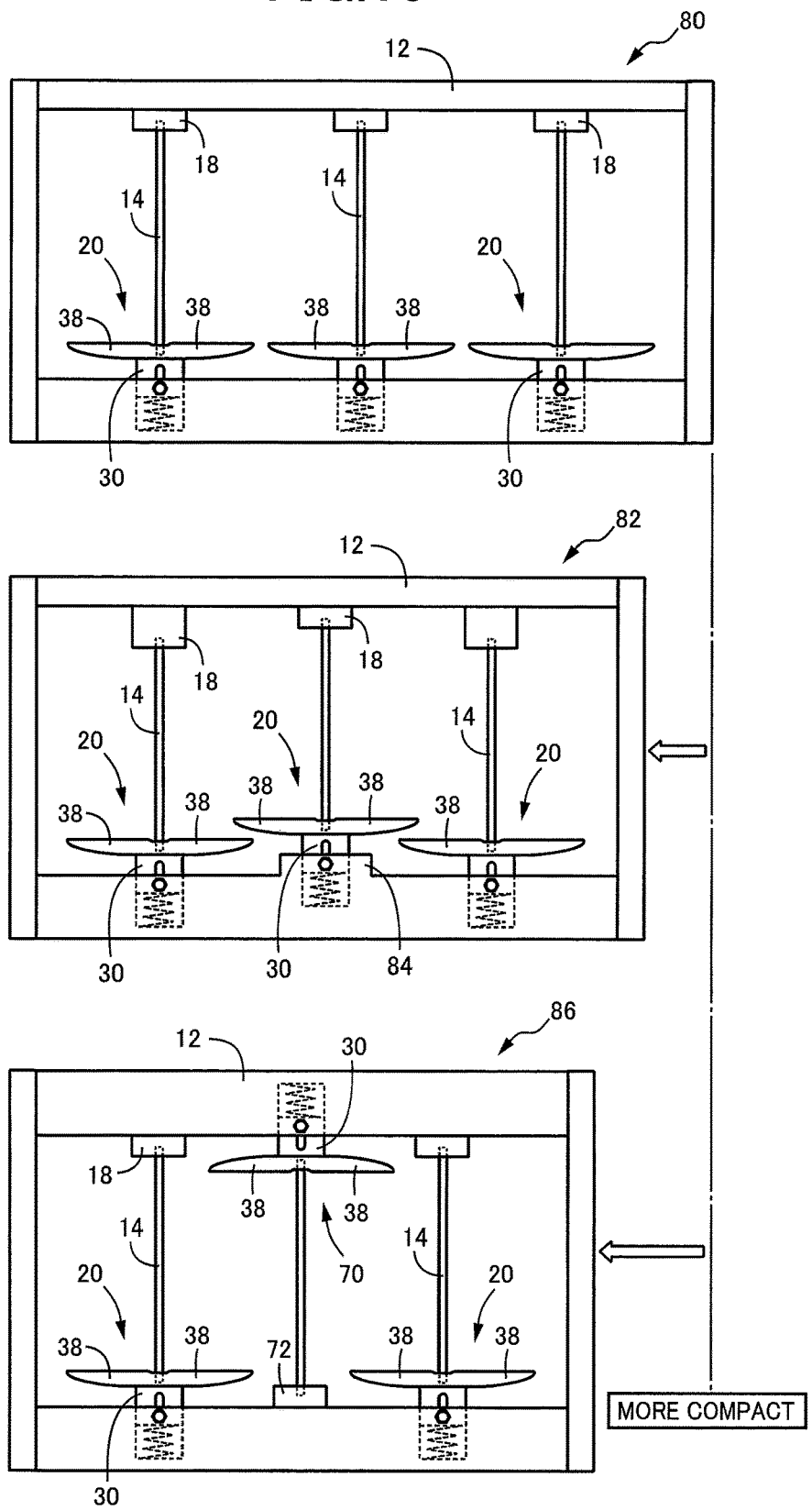
FIG. 15 is a diagram illustrating a further embodiment of the present invention, showing comparison among a normal arrangement in which tension adjusting mechanisms are disposed side by side at the lower ends of the power generation units, an arrangement in which the tension adjusting mechanisms are arranged in a staggered manner, and an arrangement in which the tension adjusting mechanisms are arranged alternately on the opposite sides in the longitudinal direction of the power generation units.

FIG. 15 is a diagram explaining that the mounting space can be reduced by the arrangement of the power generation units 14 in the case where three power generation units 14 are disposed in the holding member 12. A wind power generation system 80 in the upper stage is substantially the same as the wind power generation system 10 of FIG. 1. In the wind power generation system 80, the lower ends of the three power generation units 14 are coupled to the tension adjusting mechanisms 20. In a wind power generation system 82 in the middle stage, a stepped portion 84 is formed at the joint part of the lower end of the power generation unit 14 located in the middle so that the tension adjusting mechanisms 20 are arranged in a staggered manner. Since the airfoil-shaped portions 38 can be placed so as to partially overlap each other, the more compact wind power generation system 82 having a smaller lateral dimension than the wind power generation system 80 can be implemented. In this wind power generation system 82, in order for the plurality of power generation units 14 to have the same power generation characteristics, the thicknesses of the fixing members 18 are adjusted so that the plurality of power generation units 14 have the same length dimension. A wind power generation system 86 in the lower stage is substantially the same as the wind power generation system 76 of FIG. 14, and one ends of the power generation units 14, which are alternately located on the opposite sides, are coupled to the tension adjusting mechanisms 20, 70. The plurality of power generation units 14 can thus be placed closer to each other, whereby the more compact wind power generation system 86 having a smaller lateral dimension than the wind power generation system 82 in the middle stage can be implemented.

Figure 16:
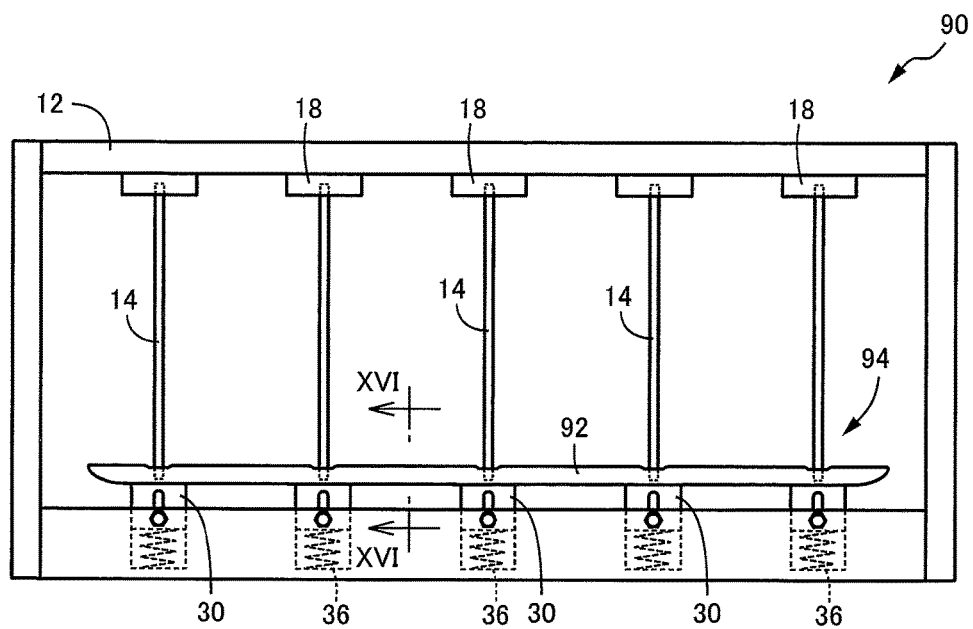
FIG. 16 is a front view illustrating a still further embodiment of the present invention in which a lift generating member is provided over a plurality of slide fitting portions.

In a wind power generation system 90 of FIG. 16, the slide fitting portions 30 are disposed at one ends on the same side in the longitudinal direction of the multiplicity of power generation units 14 that are arranged in parallel like the wind power generation system 10 of FIG. 1. A single airfoil-shaped member 92 is disposed over the multiplicity of slide fitting portions 30. A tension adjusting mechanism 94 is formed by the single airfoil-shaped member 92, the multiplicity of slide fitting portions 30, the helical compression springs 36, etc. That is, instead of the airfoil-shaped portions 38, the common airfoil-shaped member 92 serving as the lift generating member is provided for all the slide fitting portions 30. Since the airfoil-shaped member 92 is a continuous member, the area for lift generation is increased, and the lift F is increased accordingly. Since the power generation units 14 are pulled by this lift F, damage that may be caused to the power generation units 14 by strong wind can be restrained. Moreover, power generation amount can be increased by increasing the lateral dimension of the power generation units 14 etc. Alternatively, if the area for lift generation is the same, the size of the wind power generation system 90 can be reduced by placing the multiplicity of power generation units 14 close to each other. For example, the sectional shape of the airfoil-shaped member 92, namely the sectional shape taken along line XVI-XVI and viewed in the direction of arrows XVI in FIG. 16, is similar to that of the airfoil-shaped portion 38 shown in FIG. 4.

Figure 17:
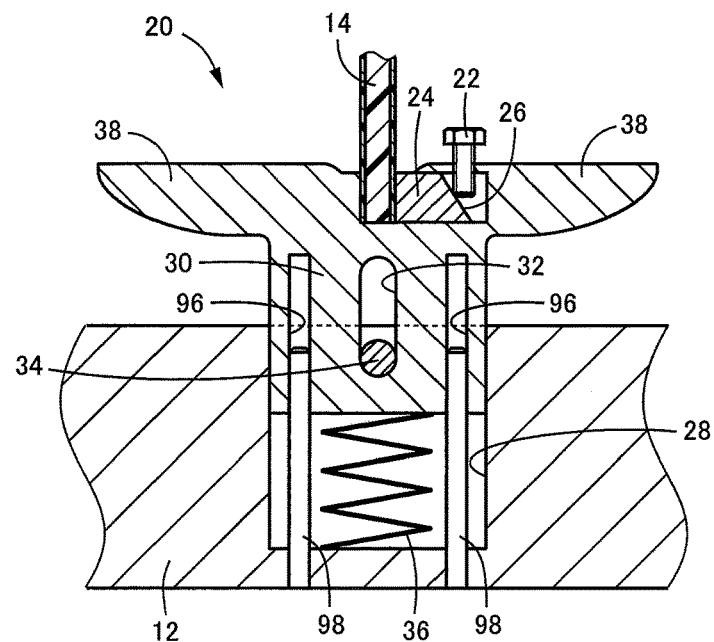
FIG. 17 is a sectional view corresponding to FIG. 3, illustrating a yet further embodiment of the present invention in which the slide fitting portion is guided by two guide pins.

FIG. 17 shows the case where the slide fitting portion 30 of the tension adjusting mechanism 20 has a pair of guide holes 96, and a pair of guide pins 98 fixedly disposed in the holding member 12 are fitted in the pair of guide holes 96. This configuration stabilizes the attitude of the slide fitting portion 30, restrains wrenching, torsion, and wobbling of the slide fitting portion 30, and allows the slide fitting portion 30 to be smoothly moved linearly between the first and second positions. Tension adjustment for the power generation unit 14 based on the wind speed can thus be made stably.

Figure 18:
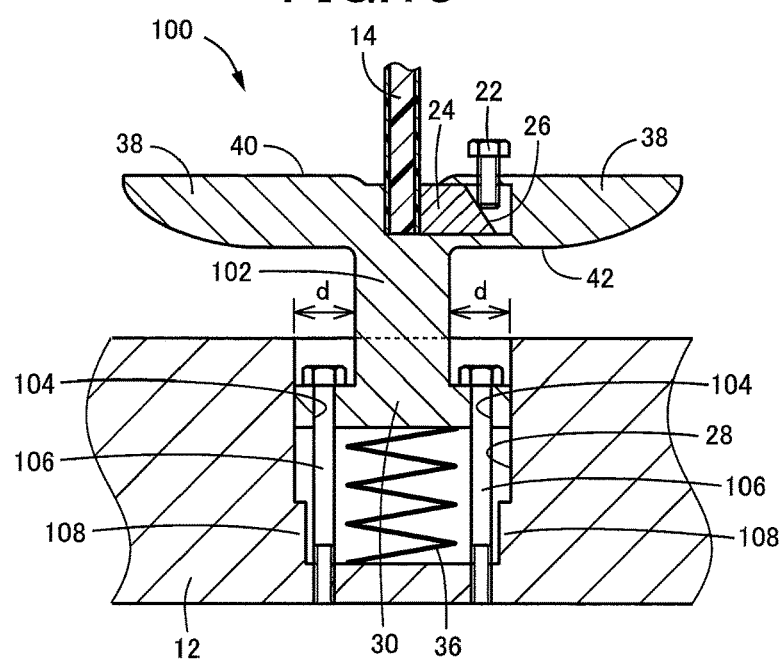
FIG. 18 is a sectional view corresponding to FIG. 3, illustrating a yet further embodiment of the present invention in which the slide fitting portion is guided by two guide pins, and a first position is determined by heads of the guide pins and a second position is determined by a small-diameter stepped portion of a fitting hole.

In a tension adjusting mechanism 100 of FIG. 18, the slide fitting portion 30 has a reduced axial dimension, and a neck portion 102 having a small diameter is formed between the slide fitting portion 30 and the pair of airfoil-shaped portions 38. In the present embodiment, the slide fitting portion 30 and the neck portion 102 correspond to the movable member. The slide fitting portion 30 has a pair of guide holes 104, and headed guide pins 106 fixedly disposed in the holding member 12 are inserted through the pair of guide holes 104. The first position is determined by the heads of the guide pins 106, and the second position is determined by a small-diameter stepped portion 108 of the fitting hole 28. As in the embodiment of FIG. 17, this configuration also stabilizes the attitude of the slide fitting portion 30, restrains wrenching, torsion, and wobbling of the slide fitting portion 30, and allows the slide fitting portion 30 to be smoothly moved linearly between the first and second positions. Tension adjustment for the power generation unit 14 based on the wind speed can thus be made stably. Since the lateral dimension on the back surface 42 side of each airfoil-shaped portion 38 is increased by the dimension d by the neck portion 102 having a small diameter, the lift F that is generated increases accordingly. Power generation amount can therefore be increased by increasing the lateral dimension of the power generation units 14 etc., or a more compact wind power generation system can be implemented by reducing the lateral dimension (airfoil length) of the airfoil-shaped portions 38. The elongated hole 32 and the positioning pin 34 are not required in the present embodiment.

Figure 19:
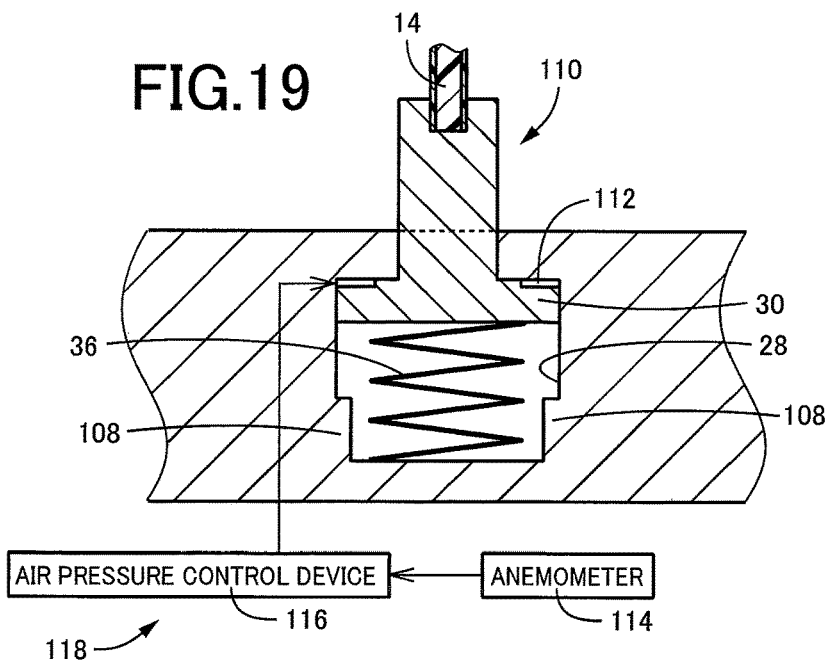
FIG. 19 is a sectional view corresponding to FIG. 3, illustrating a yet further embodiment of the present invention in which the air pressure is controlled according to the wind speed to switch the tensile force that is applied to the power generation unit.

FIG. 19 shows the case where the lower end of the power generation unit 14 is coupled to a movable member 110 having the slide fitting portion 30. The first position of the movable member 110 is determined by the slide fitting portion 30 contacting the inner wall surface of the upper end of the fitting hole 28, and the second position of the movable member 110 is determined by the slide fitting portion 30 contacting the small-diameter stepped portion 108. Normally, the movable member 110 is held at the first position by the biasing force of the helical compression spring 36. A pressure chamber 112 is provided between the slide fitting portion 30 and the inner wall surface of the upper end of the fitting hole 28. If the wind speed detected by an anemometer 114 is larger than a predetermined determination value, compressed air is supplied from an air pressure control device 116 having an air pump etc. into the pressure chamber 112. The movable member 110 is thus moved from the first position toward the second position against the biasing force of the helical compression spring 36, and the power generation unit 14 is pulled downward so that the tensile force is increased. The present embodiment thus has functions and effects similar to those of the above embodiments. In the present embodiment, a tension adjusting device 118 includes the anemometer 114 and the air pressure control device 116. The movable member 110 may be moved from the first position to the second position at a time when the wind speed is larger than the predetermined determination value, so that the tensile force that is applied to the power generation unit 14 is switched in two stages. The air pressure control device 116 electrically controls an electric air pump, a switch valve, etc. based on the wind speed detected by the anemometer 114 and supplies compressed air into the pressure chamber 112 to move the movable member 110 toward the second position. However, in the case where the anemometer 114 is rotated according to the wind speed, the air pump may be mechanically rotated by the rotation of the anemometer 114 to supply compressed air into the pressure chamber 112 so as to move the movable member 110 toward the second position.

Figure 20:
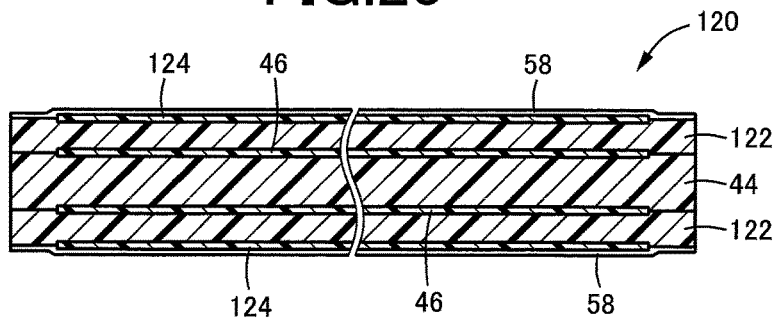
FIG. 20 is a sectional view corresponding to FIG. 7, illustrating another example of the power generation unit.
Figure 21:
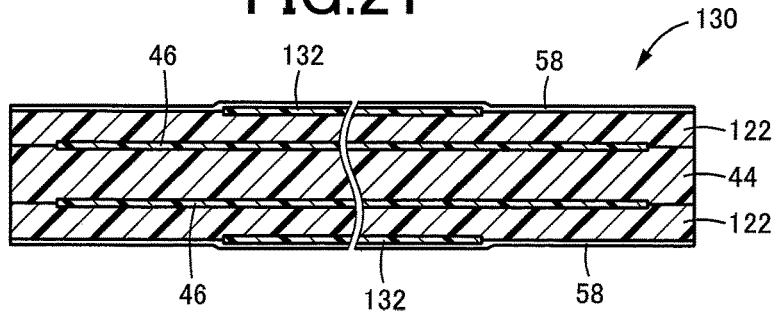
FIG. 21 is a sectional view corresponding to FIG. 7, illustrating still another example of the power generation unit.

FIGS. 20 and 21 are sectional views corresponding to FIG. 7, illustrating other examples of the power generation unit. A power generation unit 120 of FIG. 20 is different from the power generation unit 14 in that a pair of base materials 122 are stacked on both sides (outer sides) of the pair of piezoelectric films 46 bonded to both surfaces of the base material 44 and a pair of piezoelectric films 124 are further stacked on the pair of base materials 122. The power generation unit 120 thus has a seven-layer structure. The base materials 122 and the piezoelectric films 124 are made of the same materials as those of the base material 44 and the piezoelectric films 46. However, the base materials 122 are thinner than the base material 44, so that the entire base materials 122 are allowed to elastically deform in their thickness direction. In this case, electricity is generated by the total of four piezoelectric films 46, 124, whereby higher power generation efficiency can be provided.

A power generation unit 130 of FIG. 21 is different from the power generation unit 120 in that an outer pair of piezoelectric films 132 are shorter and are stacked only on the middle portions of the base materials 122 in the longitudinal direction. Since the piezoelectric films 132 are stacked only on the portions that can be deformed by a large amount, power generation capability can be efficiently improved while restraining an increase in overall rigidity of the power generation unit. Moreover, an increase in cost of the piezoelectric films due to an increase in number of stacked layers can be minimized.

Although the embodiments of the present invention are described above in detail based on the drawings, these embodiments are shown by way of example only, and the present invention can be embodied in various modified or improved forms based on the knowledge of those skilled in the art.

REFERENCE SIGNS LIST 10, 76, 80, 82, 86, 90: Wind power generation system 12: Holding member 14, 120, 130: Power generation unit 20, 70, 94, 100: Tension adjusting mechanism 30: Slide fitting portion (Movable member) 36: Helical compression spring (Elastic member) 38: Airfoil-shaped portion (Lift generating member, Tension adjusting device) 44, 122: Base material 46, 124, 132: Piezoelectric film (Piezoelectric element) 92: Airfoil-shaped member (Lift generating member, Tension adjusting device) 102: Neck portion (Movable member) 110: Movable member 118: Tension adjusting device F: Lift

The invention claimed is:

1. A wind power generation system including a power generation unit having an elastically deformable base material in a shape of a longitudinal flat plate and a piezoelectric element disposed on the base material, in which the power generation unit is held at its both longitudinal ends and is placed at a position where wind blows, and which generates electricity as the power generation unit is vibrated so that an intermediate portion of the power generation unit in a longitudinal direction reciprocates in a thickness direction of the power generation unit and the piezoelectric element is repeatedly bent and deformed by the vibration,
 a piezoelectric film made of resin being used as the piezoelectric element, and the piezoelectric element being stacked on the base material,
 at least one of the longitudinal ends of the power generation unit being coupled to a movable member that is movable in the longitudinal direction of the power generation unit,
 the wind power generation system being configured to include a tension adjusting device that, when a wind speed is increased, moves the movable member to increase a tensile force that pulls the power generation unit in the longitudinal direction, and
 the tension adjusting device being a lift generating member that is formed integrally with the movable member so as to be extended and to have wing shape to both sides of the movable member and that moves the movable member based on lift generated according to the wind speed.

2. The wind power generation system according to claim 1, wherein
 the movable member is disposed so as to be move between a first position where the tensile force is small and a second position where the tensile force is large, and is positioned at the first position by a biasing force of an elastic member, and as the wind speed increases, the movable member is moved toward the second position against the biasing force of the elastic member by the tension adjusting device.

3. The wind power generation system according to claim 1, wherein
a plurality of the power generation units are arranged in parallel inside a rectangular frame-shaped holding member in such an attitude that flat plate surfaces of the longitudinal flat plates are parallel to each other and the longitudinal directions of the power generation units extend in the same direction.

4. The wind power generation system according to claim 3, wherein
the tension adjusting device is the lift generating member that is formed integrally with the movable member so as to be extended and to have wing shape to both sides of the movable member and that moves the movable member based on the lift generated according to the wind speed, and
the movable member provided with the lift generating member is disposed at one of the longitudinal ends of each of the power generation units arranged in parallel, and the one longitudinal ends of the plurality of power generation units are located alternately on opposite sides.

5. The wind power generation system according to claim 3, wherein
of the longitudinal ends of the plurality of power generation units arranged in parallel, one longitudinal ends located on the same side in the longitudinal direction, are coupled to a plurality of the movable members corresponding to the plurality of power generation units, and
the tension adjusting device is a common lift generating member that has wing shape and is disposed over the plurality of movable members so as to be extended to both sides of the plurality of movable members and that moves the plurality of movable members together based on the lift generated according to the wind speed.

6. The wind power generation system according to claim 3, wherein
the base materials of the plurality of power generation units are different in hardness from each other, and
a wind speed range in which the tensile force is increased by the tension adjusting device varies according to the hardness of the base material.

* * * * *